(12) United States Patent
Krishnan

(10) Patent No.: US 8,434,037 B2
(45) Date of Patent: Apr. 30, 2013

(54) SUB-CIRCUIT PATTERN RECOGNITION IN INTEGRATED CIRCUIT DESIGN

(75) Inventor: Sandeep Shylaja Krishnan, Kerala (IN)

(73) Assignee: Texas Instruments Incorporated, Dallas, TX (US)

(*) Notice: Subject to any disclaimer, the term of this patent is extended or adjusted under 35 U.S.C. 154(b) by 207 days.

(21) Appl. No.: 12/323,483

(22) Filed: Nov. 26, 2008

(65) Prior Publication Data

US 2010/0131908 A1 May 27, 2010

(51) Int. Cl.
*G06F 9/455* (2006.01)
*G06F 17/50* (2006.01)

(52) U.S. Cl.
USPC ........... 716/107; 716/106; 716/110; 716/111; 716/126; 716/136; 703/20

(58) Field of Classification Search .................. 716/106, 716/107, 110, 111, 126, 136; 703/20
See application file for complete search history.

(56) References Cited

U.S. PATENT DOCUMENTS

| 2004/0019857 | A1* | 1/2004 | Teig et al. ........................ 716/1 |
| 2006/0222964 | A1* | 10/2006 | Futatsuya et al. ................ 430/5 |
| 2007/0256037 | A1* | 11/2007 | Zavadsky et al. ................ 716/2 |
| 2008/0282212 | A1* | 11/2008 | Dennison et al. ............... 716/10 |
| 2009/0055552 | A1* | 2/2009 | Swildens ...................... 709/241 |

* cited by examiner

*Primary Examiner* — Nha Nguyen
(74) *Attorney, Agent, or Firm* — Lawrence J. Bassuk; W. James Brady; Frederick J. Telecky, Jr.

(57) ABSTRACT

A method and system for sub-circuit pattern recognition in integrated circuit design is disclosed. In one embodiment, a method for recognizing a pattern circuit in a target circuit, includes encoding the pattern circuit and the target circuit by processing a first netlist of the pattern circuit and a second netlist of the target circuit, generating a cross-linked data structure based on attributes and connectivity information of at least two devices and at least one net from the first netlist, and identifying an instance of the pattern circuit in the target circuit based on an associative mapping between the pattern circuit and a sub-circuit of the target circuit using a device integer array and a net integer array. Each of the first netlist and the second netlist is based on the at least two devices and the at least one net connecting the at least two devices.

18 Claims, 8 Drawing Sheets

SUB-CIRCUIT PATTERN RECOGNITION IN INTEGRATED CIRCUIT DESIGN

FIELD OF TECHNOLOGY

Embodiments of the present invention relate to the field of electronics. More particularly, embodiments of the present invention relate to a circuit pattern search technique.

BACKGROUND

A sub-circuit extraction, which is a special form of the sub-graph isomorphism problem in graph theory, is identification of instances of a pattern circuit in a large circuit schematic. The sub-circuit extraction may be done by checking presence of the pattern circuit in the large circuit schematic. However, the sub-circuit extraction may not be a straightforward comparison of devices or components present in the pattern circuit to their counterpart devices or components in the large circuit schematic. That is, the connectivity between the counterpart devices or components in the large circuit schematic has to topologically match the connectivity of the devices or components in the pattern circuit. Additionally, the computational complexity for the extraction scheme may grow significantly as the size of the pattern circuit or the large circuit schematic increases.

SUMMARY

A method and system for sub-circuit pattern recognition in integrated circuit design is disclosed. In one aspect, a method for recognizing a pattern circuit in a target circuit, includes encoding the pattern circuit and the target circuit by processing a first netlist of the pattern circuit and a second netlist of the target circuit, generating a cross-linked data structure based on attributes and connectivity information of at least two devices and at least one net from the first netlist, and identifying an instance of the pattern circuit in the target circuit based on an associative mapping between the pattern circuit and a sub-circuit of the target circuit using a device integer array and a net integer array. Each of the first netlist and the second netlist is based on the at least two devices and the at least one net connecting the at least two devices. Further, the cross-linked data structure includes the device integer array for the at least two devices and the net integer array for the at least one net of the pattern circuit.

Further, identifying the instance of the pattern circuit includes selecting a first target device in the target circuit, and checking the first target device in the target circuit for pseudo-matching with the first pattern device of the pattern circuit. The pseudo-matching is performed by comparing a type of the first target device in the target circuit with the type of the first pattern device of the pattern circuit and a number of neighboring nets of the first target device with a number of neighboring nets of the first pattern device. Furthermore, if the pseudo-matching is determined, the identifying the instance of the pattern circuit includes writing a name of the first target device to the content of the first pattern device in the device integer array.

Moreover, the identifying the instance of the pattern circuit includes selecting a second target device in the target circuit. The second target device is connected to one of the neighboring nets of the first target device, and the second target device has the least number of neighboring nets among target devices connected to the neighboring nets of the first target device. The identifying the instance of the pattern circuit is realized if every content of the device integer array and the net integer array of the pattern circuit is filled up.

The methods, systems, and apparatuses disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

Embodiments of the present invention are illustrated by way of examples and not limited to the figures of the accompanying drawings, in which like references indicate similar elements and in which.

Other features of the present embodiments will be apparent from the accompanying drawings and from the detailed description that follows.

DETAILED DESCRIPTION

A method and system for sub-circuit pattern recognition in integrated circuit design is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
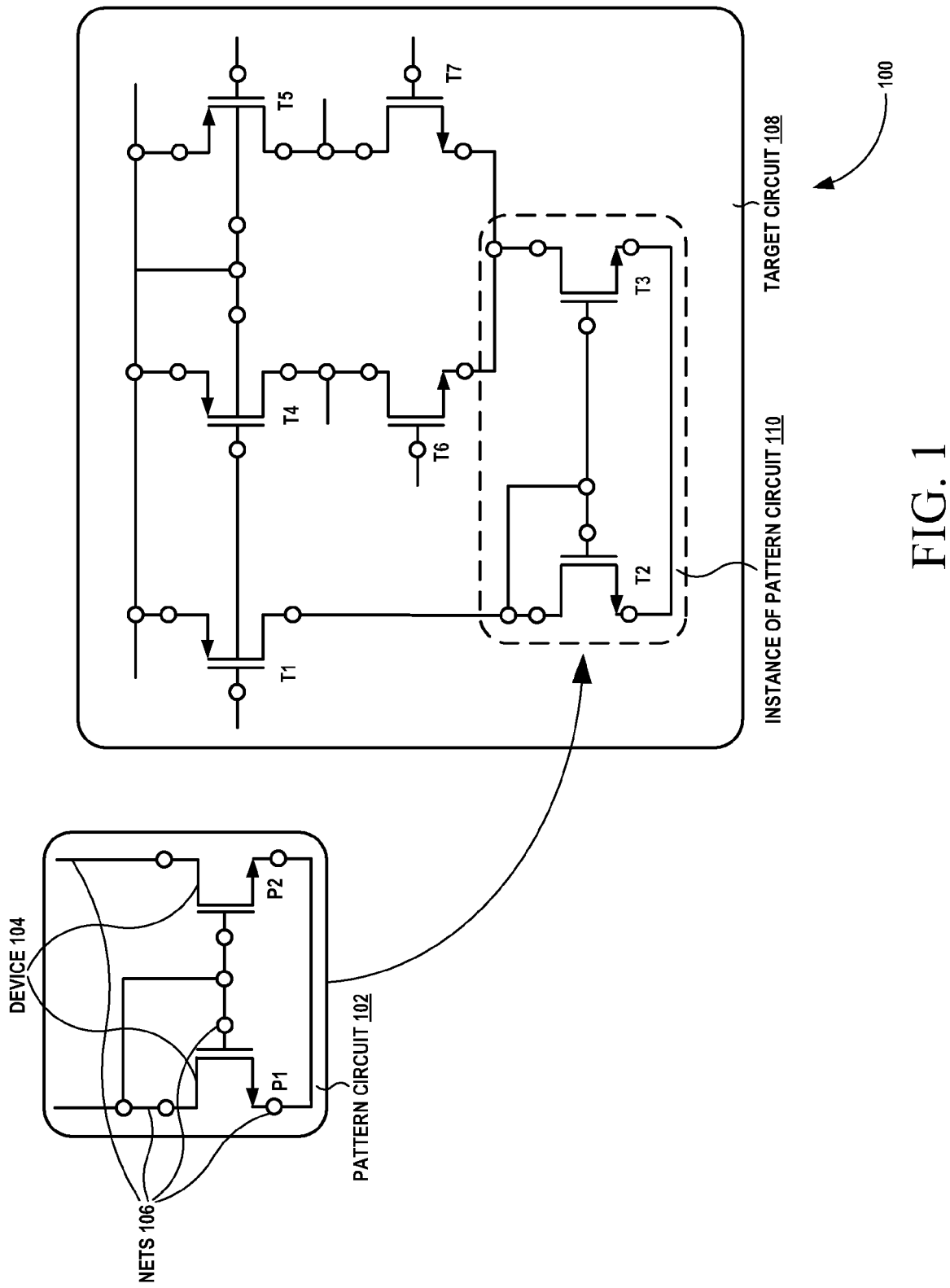
FIG. 1 is a block diagram of a pattern circuit and a target circuit, according to one embodiment.

FIG. 1 is a block diagram 100 of a pattern circuit 102 and a target circuit 108, according to one embodiment. Particularly, FIG. 1 illustrates the pattern circuit 102, the target circuit 108 and an instance of pattern circuit 110. FIG. 1 is an exemplary circuit to illustrate identifying an instance of the pattern circuit 110 in the target circuit 108. As shown in FIG. 1, the pattern circuit 102 includes a plurality of devices 104 and a plurality of nets 106. Further, the pattern circuit 102 includes devices $P_1$ and $P_2$, and the target circuit 108 includes devices $T_1, T_2, T_3, T_4, T_5, T_6$ and $T_7$ as shown in FIG. 1. In one example embodiment, the set of devices are identified in the target circuit 108 that resembles the set of devices 104 in the pattern circuit 102 and also resembling the connectivity (e.g., the nets 106) between the device terminals.

For explaining the circuit-graph properties for the block diagram 100 shown in FIG. 1, consider device level netlists of analog and digital circuits that are represented at as a graph of attributed vertices and edges G ($V_a, E_a$), where $V_a = V_d \cup V_n$. $V_d$ represents the set of devices and $V_n$ represents the set of nets. Further, isomorphism needs to exist amongst the attributes of the corresponding vertices/edges of the graphs associated with pattern circuit 102 (i.e., G ($V_{ap}, E_{ap}$)) and the target circuit 108 (i.e., G ($V_{at}, E_{at}$)). It can be noted that, the $V_d$ and $V_n$ need not be treated equivalently. Following properties of circuit-graphs have been identified for use in minimizing the graph data processing operations, as explained in later sections:

1. The order of nodes, $V_{di} \in V_d$, shall be same for corresponding nodes in a sub-graph of the pattern circuit and its instance in the target circuit, $\forall$ i $\in$ | $V_d$|. Where, the order of nodes $V_{ni} \in V_n$ can be different. . . . (1)
2. The graphs are bipartite, so any pattern spanning tree, followed during search shall encounter a device $V_{di} \in V_d$ after a net and vice versa. . . . (2)
3. $V_d$ consists of devices of various types, e.g. MOSFETS, resistors, capacitors, etc. Where $V_n$ consists of nodes of only one type, namely net. . . . (3)
4. An edge $e_{api} \in E_{ap}$ matches an edge $e_{ati} \in E_{at}$ only if the device terminal name at the device ends of the edges match. This is because all terminals of a device need not be identical unless equivalence exists (e.g. terminals of bilateral device). Nets do not have distinct terminals. . . . (4)
5. The images for all $V_{di} \in V_d$ in $G_p$, need to be searched for in $G_t$. But $V_{ni} \in V_n$ of unit order need not be searched. . . . (5)

Figure 2:
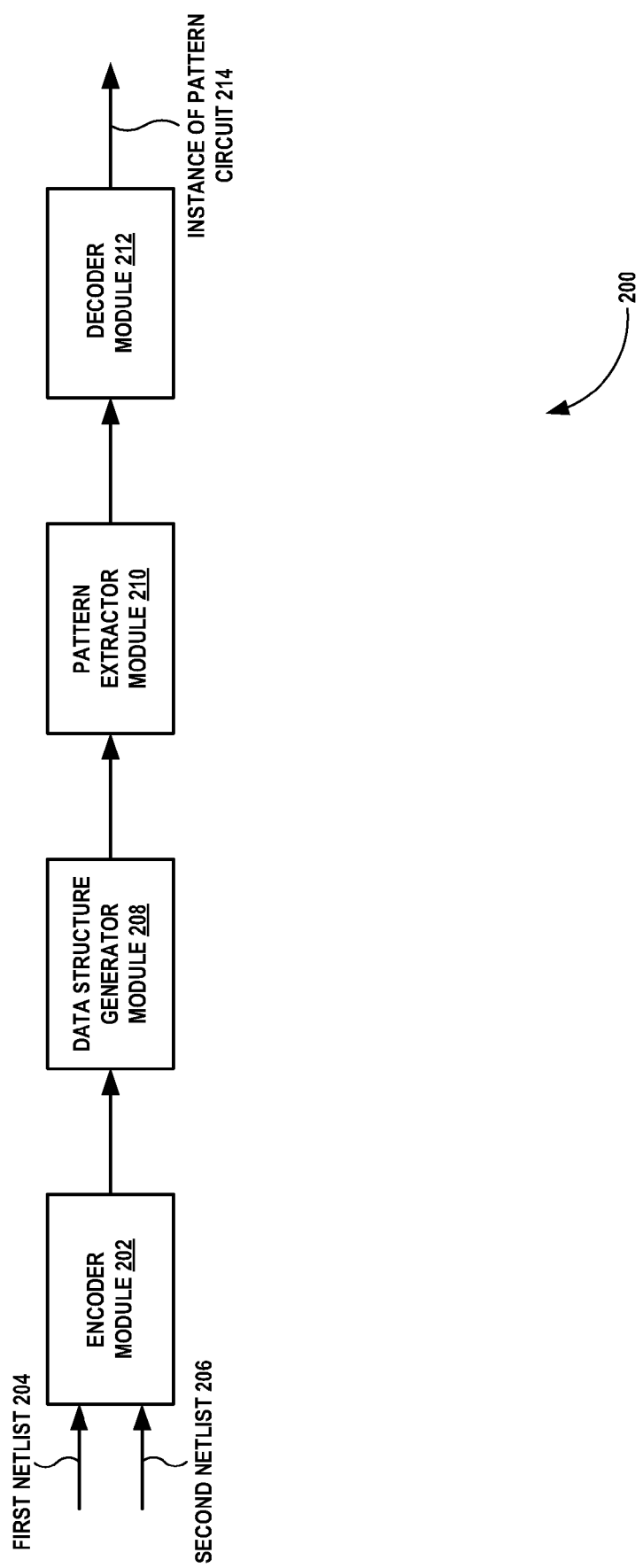
FIG. 2 is a block diagram of an exemplary system diagram for recognizing an instance of a pattern circuit in a target circuit, according to one embodiment.

FIG. 2 is a block diagram of an exemplary pattern extracting system 200 for recognizing an instance of a pattern circuit in a target circuit, according to one embodiment. Particularly, FIG. 2 illustrates an encoder module 202, a data structure generator module 208, a pattern extractor module 210, and a decoder module 212.

In operation, the encoder module 202 encodes the pattern circuit and the target circuit by processing a first netlist 204 of the pattern circuit and a second netlist 206 of the target circuit. In these embodiments, each of the first netlist 204 and the second netlist 206 is based on at least two devices and at least one net connecting the at least two devices. In one exemplary implementation, the encoder module 202 is operable for encoding character strings for device names and net names of the pattern circuit and the target circuit into corresponding numbers.

Further in operation, the data structure generator module 208 generates a cross-linked data structure based on attributes and connectivity information of the at least two devices and the at least one net from the first netlist 204. In these embodiments, the cross-linked data structure includes a device integer array for the at least two devices and a net integer array for the at least one net of the pattern circuit. In one example embodiment, the attributes include a name, a type, and an order, and the connectivity information includes at least one neighboring device or net. In another example embodiment, each index of the device integer array and the net integer array includes a name of each device and each net of the pattern circuit, respectively. Further, each content of the device integer array and the net integer array is filled with −1 prior to the identifying the instance of the pattern circuit.

Further in operation, the pattern extractor module 210 identifies an instance of the pattern circuit in the target circuit based on an associative mapping between the pattern circuit and a sub-circuit of the target circuit using the device integer array and the net integer array. In one exemplary implementation, identifying the instance of the pattern circuit includes determining an order of the at least two devices from the pattern circuit for the associative mapping. Further, determining the order includes choosing a first pattern device from the pattern circuit whose type is the least in number in the target circuit and whose location is close to a center of the pattern circuit. Further, the decoder module 212 decodes corresponding device names and net names associated with the sub-circuit of the target circuit.

In accordance with respect to FIG. 2, the pattern extracting system 200 takes circuit-graph data, the first netlist 204 of the pattern circuit and the second netlist 206 of the target circuit as its input signal, and generates the instance of pattern circuit 214 as the output signal using the SI algorithm. The pattern extractor module 210 includes a filter designed to sieve out the desired signal. Before processing, the second netlist 206 is transformed to a representation that is computationally easier to operate with.

Further, signal theory treats the input signals as being composed of linear combination a series of frequencies that form a set of basis vectors spanning the vector space of signals. For example, a given circuit-graph can be split into a set of sub-graphs. The signal space formed by infinite set of possible $G_t$ ($V_{at}, E_{at}$) is spanned by infinite set of sub-graphs $G_p$ ($V_{ap}, E_{ap}$). In one embodiment, signal filtering operation filters out the components of desired spanning vectors. Therefore, this insight helps in visualizing and arriving at the instance of the pattern circuit 214.

Figure 3:
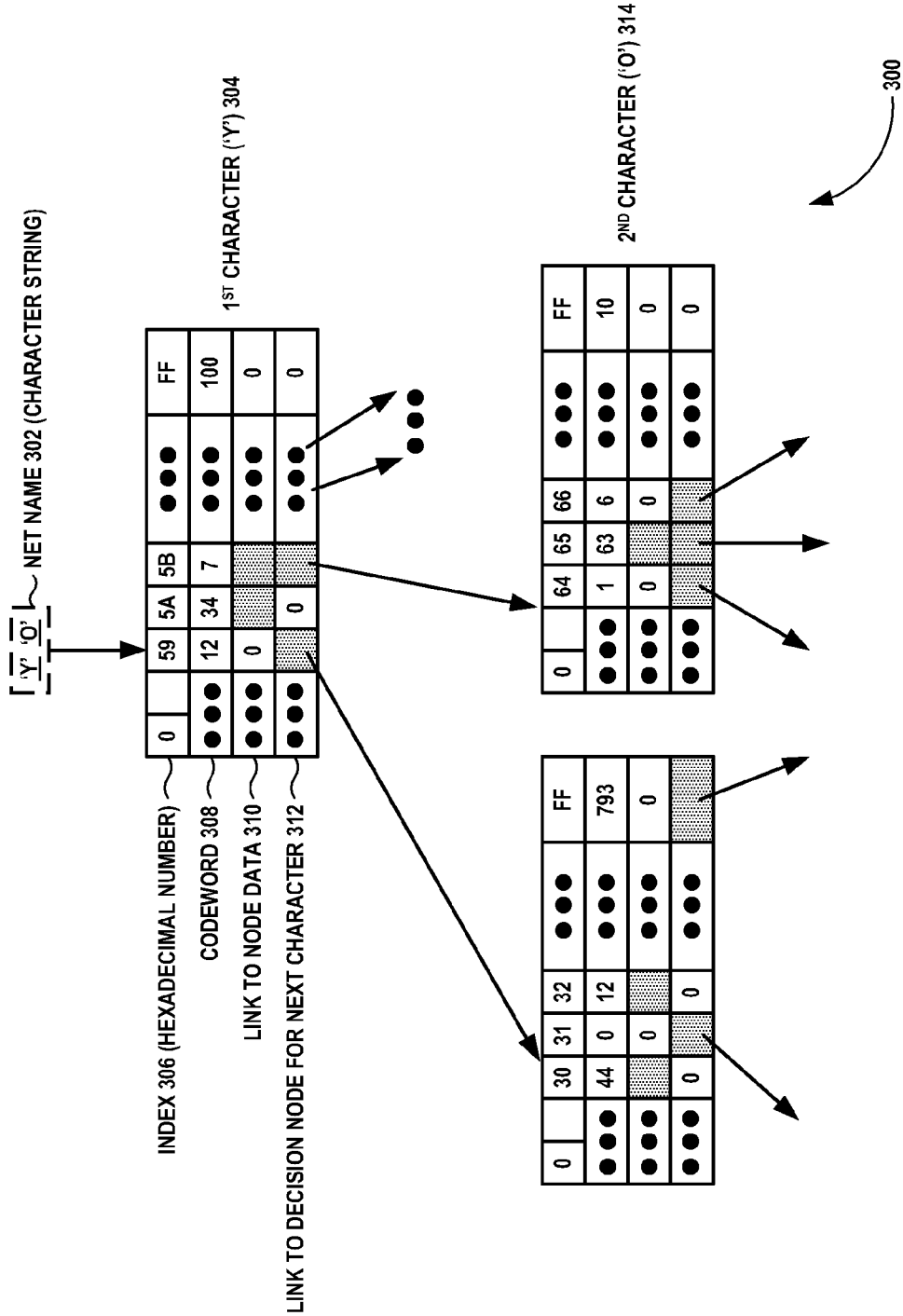
FIG. 3 illustrates a codebook of an exemplary hash function which transforms character strings into numbers, according to one embodiment.

FIG. 3 illustrates a codebook 300 of an exemplary hash function which transforms character strings into numbers, according to one embodiment. Particularly, FIG. 3 illustrates a dynamic decision tree scheme for transforming the character strings into the numbers. In one example embodiment, encoding the pattern circuit and the target circuit includes encoding character strings for device names and net names 302 of the pattern circuit and the target circuit into corresponding numbers (i.e., Index 306 (e.g., hexadecimal number)). Further, the character strings are translated in to the corresponding numbers using a hash function. Furthermore, the codebook 300 of the hash function is stored. In one embodiment, the codebook 300 is used to decode corresponding device names and net names associated with the sub-circuit of the target circuit.

The dynamic decision tree scheme illustrated in FIG. 3 uses array indexing at decision nodes and linking pointers as the edges of the decision tree, forming path between the nodes. It is appreciated that, the array indexing is the fastest amongst hash mapping approaches. Also, the approach is dynamic in which the codebook 300 is generated for the name strings.

The encoding process (i.e., encoding the pattern circuit and the target circuit) includes character by character sorting of node names. In one example embodiment, each device in the pattern circuit and the target circuit is represented as the nodes. Further, a character is stored in a computer as its equivalent integer value using 8 bits, such that it can be used as index of an array of size $2^8 = 256$. Furthermore, the decision nodes consist of an array of elements that are allocated dynamically. Moreover, the elements include links (e.g., pointers) to node data 310, and decision node for next character 312 which are initially '0' (NULL) when the decision node is created. In one example embodiment, the maximum level of the decision tree is the character length of longest node name string in the target circuit.

In the example embodiment illustrated in FIG. 3, consider a net name 302 (i.e., character string) "Y0" is encountered, which has not been encoded earlier. As shown in FIG. 3, "Y" represents the first character 304 and "0" represents the second character 314. Further as shown in FIG. 3, the ASCII values of the first character 304 (i.e., Y) and the second character 314 (i.e., 0) are 0x59 and 0x30 respectively.

In operation, the $0x59^{th}$ element in level-0 decision node is accessed and when the link to next character is empty, a new decision node is allocated and linked to the created $1^{st}$ array element of level-1 decision-node. Further, the element in this decision node at the index 306 is accessed as next character (0x30). At this instance, the field for the link to node data 310 is allocated with pointer to node data. In one example embodiment, this field acts as a flag to determine whether the string is represented by the path till that node, has been encountered earlier. Since this is the last node, decision making stops and the numerical code (44) representing the node name is assigned, assuming that the last node discovered is 43. Further, it can be noted that the link to decision node for next character 312 for this level-1 decision node is 0 (NULL). However, the link to decision node for next character 312 is allocated when a new longer node name with first 2 characters as "Y0" is encountered.

In one exemplary implementation, when the node "Y0" is encountered in the netlist for the next time, the decision tree proceeds in a similar fashion except that no new nodes are created, and after level-1, the stored value 44 gets accessed and used. Further as shown in FIG. 3, the numbers under $0x59^{th}$ array element in level-0 decision node suggest that the node name "Y" has not been encountered till now as the link to node data 310 is 0 (NULL). Therefore, the codeword 308 having value 12 is just a garbage data.

Further, the numbers under $0x5A^{th}$ array element in level-0 decision node suggest that a name string "Z" (=0x5A) is encountered and named as 34 because the link to node data 310 is not 0 (NULL). But there are no longer name strings encountered starting with character 'Z' as the link to decision node for next character 312 is 0 (NULL).

In one example embodiment, the link to node data 310 in each of the array elements acts as a pointer to elements in another array whose each element stores data (e.g., type, neighbors, etc) about the nodes. Also, once the encoding process is done the codebook 300 is stored as an array which is used for decoding of the net name 302 (i.e., character strings) from the numerical code for identifying the instances of the pattern circuit in string format.

Figure 4:
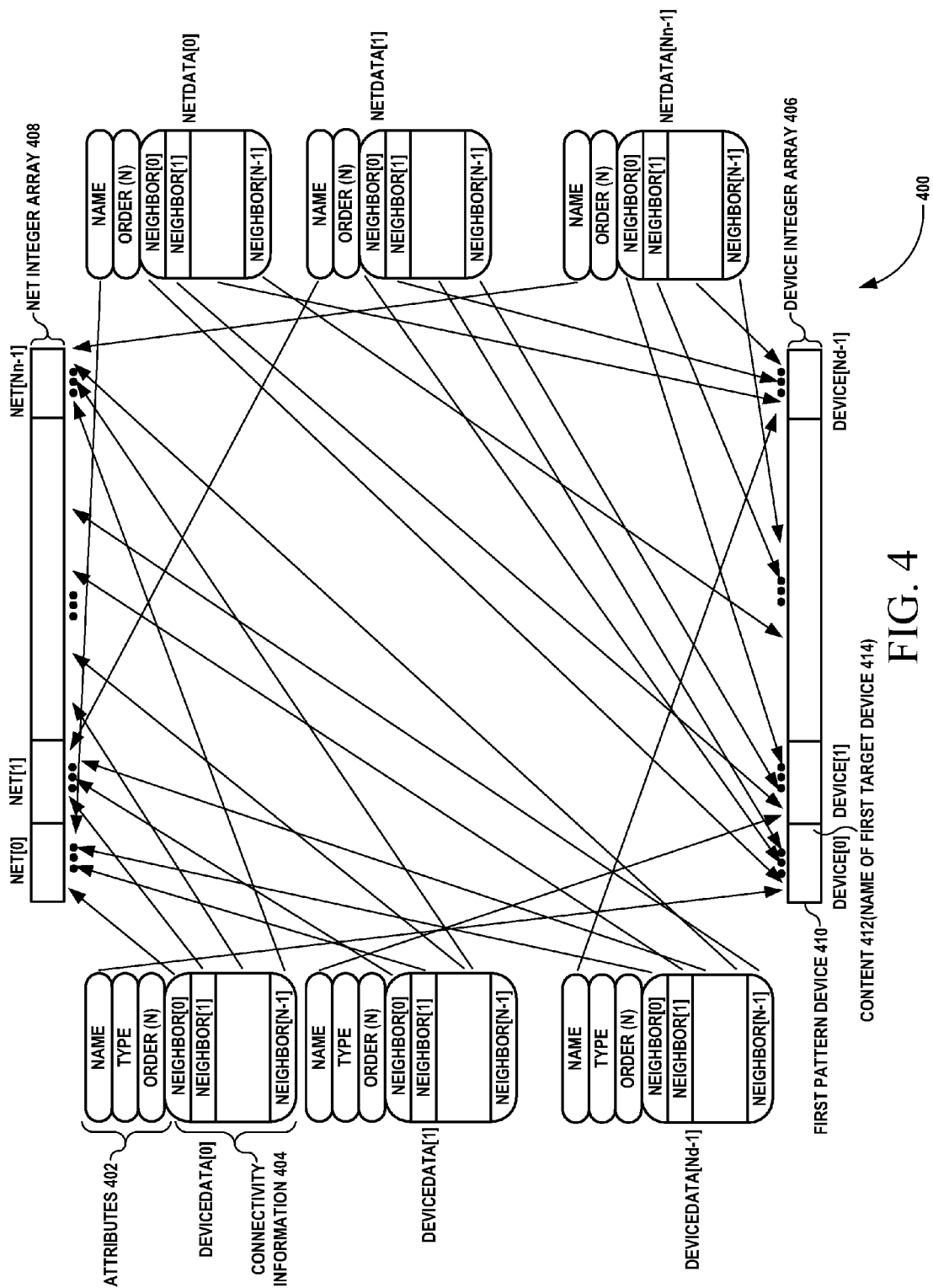
FIG. 4 illustrates an exemplary cross-linked data structure for associative mapping of a pattern circuit and a target circuit, according to one embodiment.

FIG. 4 illustrates an exemplary cross-linked data structure 400 for associative mapping of a pattern circuit and a target circuit, according to one embodiment. Particularly, FIG. 4 illustrates attributes 402 and connectivity information 404 of the devices and the nets, a device integer array 406, and a net integer array 408. In one example embodiment, the attributes 402 for the devices include name, type and order of the devices and the connectivity information 404 for the devices include neighboring devices associated with each device. In another example embodiment, the attributes for the nets include name, and order of the nets and the connectivity information for the nets includes neighboring devices for each net. Further as shown in FIG. 4, the device integer array 406 includes a first pattern device 410, and content 412 including a name of the first target device 414.

In operation, a cross-linked data structure is generated based on the attributes 402 and connectivity information 404 of the at least two devices and the at least one net from the first netlist. In one example embodiment, the cross-linked data structure includes the device integer array 406 for the at least two devices and the net integer array 408 for the at least one net of the pattern circuit. For example, the attributes 402 include a name, a type, and an order, and the connectivity information 404 includes at least one neighboring device or net. Further, each index of the device integer array 406 and the net integer array 408 includes a name of each device and each net of the pattern circuit, respectively. In one exemplary implementation, each content of the device integer array 406 and the net integer array 408 is filled with −1 prior to the identifying the instance of the pattern circuit.

Further in operation, an instance of the pattern circuit is identified in the target circuit based on an associative mapping between the pattern circuit and a sub-circuit of the target circuit using the device integer array 406 and the net integer array 408. In one exemplary implementation, identifying the instance of the pattern circuit includes selecting a first target device in the target circuit, and checking the first target device in the target circuit for pseudo-matching with the first pattern device of the pattern circuit. In one example embodiment, the pseudo-matching is performed by comparing a type of the first target device 414 in the target circuit with the type of the first pattern device 410 of the pattern circuit and a number of neighboring nets of the first target device 414 with a number of neighboring nets of the first pattern device 410.

In one exemplary implementation, if the pseudo-matching is determined, the identifying the instance of the pattern circuit includes writing a name of the first target device 414 to the content 412 of the first pattern device 410 in the device integer array 406.

In one exemplary implementation, identifying the instance of the pattern circuit further includes selecting a second target device in the target circuit such that the second target device is connected to one of the neighboring nets of the first target device, and the second target device has the least number of neighboring nets among target devices connected to the neighboring nets of the first target device.

Further in operation, identifying the instance of the pattern circuit is realized if entire content of the device integer array 406 and the net integer array 408 of the pattern circuit is filled up.

In accordance with the above described embodiment and with reference to FIG. 4, the cross-linked data structure 400 is an elegant and efficient way for representing circuit-graph data of the pattern circuit. In one example embodiment, the net names and the device names are represented as numbers. In one exemplary implementation, the cross-linked data structure 400 is implemented using C language.

In the example embodiment illustrated in FIG. 4, let $N_d$ be the number of devices and $N_n$ be the number of nets. Further, the pattern extractor module 210 includes 2 integer arrays, i.e., the device integer array 406 and the net integer array 408, and 2 struct arrays i.e., DeviceData [$N_d$] and NetData [$N_n$]. As shown in FIG. 4, the DeviceData includes a name, type, order and neighboring devices for each device and the NetData includes a name, order and neighboring devices for each net. The device integer array 406 and the net integer array 408 act as an associative mapping between nodes of the pattern circuit and the target circuit. The index represents name as in pattern circuit and the content 412 includes the name of the matching target device/node 414. In addition, each element of the 2 struct arrays includes the attributes 402 and connectivity information 404 of the nodes as shown below:

1. (int*) name: Points to name of the net/device
2. (int) Type: Only for devices
3. (int) Order of the node (N): Total number of neighboring devices (or nets) of the net (or device)
4. (int**) Neighbor: Array of size N. Each element is a pointer to the neighbor.

During the setup phase, the connectivity information 404 of the pattern circuit is converted to the mapping of pointers as illustrated in FIG. 4. The elements of array Neighbor [ ] that are part of struct elements of the DeviceData [ ] (or the NetData [ ]) are made to point to the element in Net [ ] (or Device [ ]). For example, consider a device named '0' in a circuit as a 3-terminal MOSFET connected to nets 12, 33 and 57 in the circuit. Then, in C language syntax, DeviceData [0].order is assigned a value 3. Therefore, DeviceData [0].Neighbor [ ] is an array of size 3, whose elements point to Net [12], Net [33] and Net [57] respectively. Further, DeviceData [i].Name points to Device [i] for all integer values of i ∈ [0, $N_d-1$]. Similarly, corresponding mapping exists for the NetData [ ].

During identification, the elements of the array DeviceData [ ] are filled in one after the other which can be referred to as propagation of signal $G_t$ through filter data structure $G_p$. Further, the processing in filter is represented by the pseudo matching which determines whether the $i^{th}$ element filled in is accepted to proceed to $(i+1)^{th}$ element or needs to be rejected to flush and either to fill next candidate, if there, for $i^{th}$ or recede to $(i-1)^{th}$ element.

In one embodiment, the instance of pattern circuit is said to be identified when propagating signal succeeds in passing out of the $(N_d-1)^{th}$ element of the filter. For example, if the depth of identification tree is considered as amplitude, then it can be phrased in a crude way as "a notch filter with sharp roll-off that passes desired components (valid pattern instances) with full amplitude and sharp attenuation for non-matching identification trees".

The cross-linked data structure 400 is realized as a scatter of devices with nets connecting them. It can be noted that, if the elements of the DeviceData [ ] are filled, then other arrays, i.e., the NetData [ ], the Device [ ] and the Net [ ] are automatically updated due to pointer mechanism. These features make the pattern extractor module a powerful aid to optimize the search operation as explained in later sections.

Figure 5:
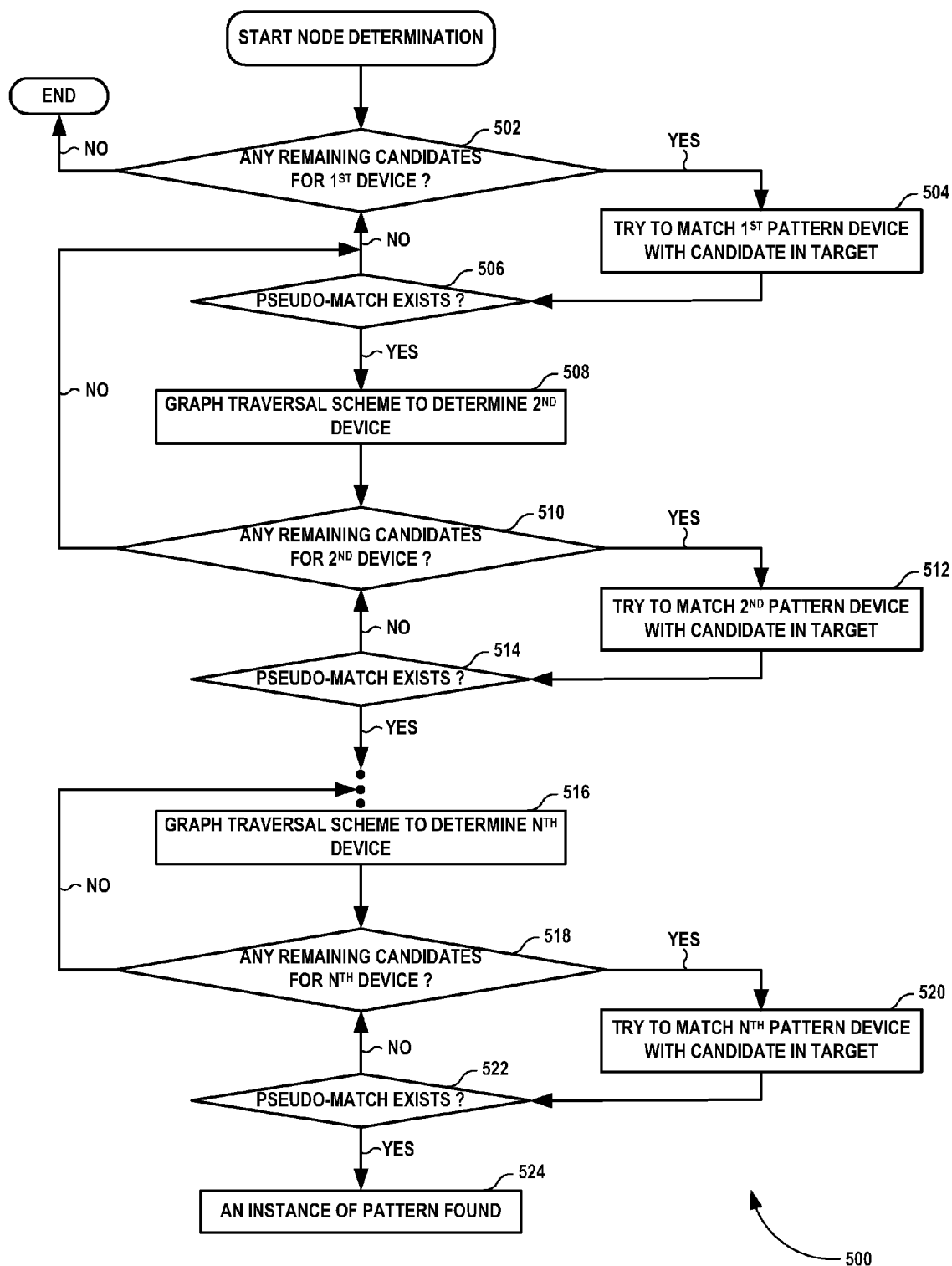
FIG. 5 is a flow chart of an exemplary method for identifying an instance of a pattern circuit from a target circuit, according to one embodiment.

FIG. 5 is a flow chart 500 of an exemplary method for identifying an instance of a pattern circuit from a target circuit, according to one embodiment. In one embodiment, the identifying the instance of the pattern circuit includes determining an order of at least two devices from the pattern circuit for associative mapping. In one example embodiment, the order includes choosing a first pattern device from the pattern circuit whose type is the least in number in the target circuit and whose location is close to a center of the pattern circuit.

In one exemplary implementation, identifying the instance of the pattern circuit from the target circuit starts with determining a start node in the pattern circuit. In step 502, a check is made to determine whether there are any candidates remaining in the target circuit for the first pattern device in the pattern circuit. In one example embodiment, a device in the target circuit is referred to as the candidate. If no candidate is remaining for the first pattern device, then the process 500 terminates. In step 504, matching the first pattern device in the pattern circuit with the candidate in the target circuit is performed, if at least one candidate is remaining for the first pattern device.

In step 506, a check is made to determine whether pseudo-match exists between the first pattern device and the at least one candidate in the target circuit. In one example embodiment, a node (e.g., candidate) in the target circuit is a pseudo-match to the node (i.e., pattern device) in the pattern circuit if they are of same type and its neighbors at various terminals in the pattern circuit also have corresponding match in the target circuit. If the pseudo-match does not exist between the first pattern device and the at least one candidate in the target circuit, then the process 500 goes to step 502. If the pseudo-match exists between the first pattern device and the at least one candidate in the target circuit, then the process 500 goes to step 508, in which a graph traversal scheme is implemented to determine the second pattern device in the pattern circuit.

In step 510, a check is made to determine whether there are any candidates remaining in the target circuit for the second pattern device in the pattern circuit. If no candidate is remaining for the second pattern device, then the process 500 goes to step 502. In step 512, matching the second pattern device in the pattern circuit with the candidate in the target circuit is performed, if at least one candidate is remaining for the second pattern device.

In step 514, a check is made to determine whether pseudo-match exists between the second pattern device and the at least one candidate in the target circuit. If the pseudo-match does not exist between the second pattern device and the at least one candidate in the target circuit, the process 500 goes to step 502. If the pseudo-match exists between the second pattern device and the at least one candidate in the target circuit, then the process 500 goes to next step, in which a graph traversal scheme is implemented to determine the next pattern device in the pattern circuit.

The above mentioned process is repeated for all the pattern devices (e.g., till $N^{th}$ device as illustrated in FIG. 5) in the pattern circuit. Similarly, a graph traversal scheme is implemented to determine the $N^{th}$ pattern device in the pattern circuit. In step 518, a check is made to determine whether there are any candidates remaining in the target circuit for the $N^{th}$ pattern device in the pattern circuit. In step 512, matching the $N^{th}$ pattern device in the pattern circuit with the candidate in the target circuit is performed, if at least one candidate is remaining for the $N^{th}$ pattern device.

In step 522, a check is made to determine whether pseudo-match exists between the $N^{th}$ pattern device and the at least one candidate in the target circuit. If the pseudo-match does not exist between the $N^{th}$ pattern device and the at least one candidate in the target circuit, the process 500 goes to step 518. If the pseudo-match exists between the $N^{th}$ pattern device and the at least one candidate in the target circuit, then the process 500 goes to step 524. In step 524, the instance of the pattern circuit is identified from the target circuit if the pseudo-match between all the pattern devices in the pattern circuit and the candidates in the target circuit are successful.

In accordance with the above described embodiment and with reference to FIG. 5, the process of identifying the instance of the pattern circuit in the target circuit starts with choosing a start node in the pattern circuit. Further, the process tries to find a matching node in the target circuit, checks for pseudo-match criterions, chooses the next node in the pattern circuit to proceed with, searches for a matching node for this in the target circuit and so on. As mentioned above, a node in the target circuit is a pseudo-match to a node in the pattern circuit if they are of same type and its neighbors at various terminals in the pattern circuit also have corresponding match in the target circuit.

Further, with respect to the circuit-graph properties mentioned in FIG. 1, the second circuit-graph property (i.e., 2) signifies that neighbors of a device are always nets and vice versa. Therefore, the second circuit-graph property signifies that both net and device nodes need not be processed. Furthermore, the third circuit-graph property (i.e., 3) signifies that for a net only neighborhood/connectivity needs to be checked, since net is of only single type unlike device. In addition, the circuit-graph properties (2) and (3) along with (1), (4) and (5) signify that only devices are to be used as nodes in the decision tree and nets act as a path between the devices.

The above described cross-linked data structure includes a pointer mechanism to inherently perform the checks for net connectivity when the devices are processed. In the example embodiment illustrated in FIG. 5, the process 500 uses only the devices as nodes and the net data is used as path to proceed to next device in the decision tree, without explicitly performing pseudo-match checks for nets. The pseudo-match checks performed on the (device) nodes are as follows:

1. Whether the device types match . . . (6)
2. Whether $N_{it} \geq N_{ip}$ $\forall i \in [0, N-1]$ . . . (7), Where, $N_{it}$ and $N_{ip}$ are orders of net connected to $i^{th}$ terminal of the device in the target circuit and the pattern circuit respectively, N is number of terminals of the device (i.e., the device node order as in bipartite graph representation).

The connectivity check for the net and the device is performed simultaneously using the above mentioned equation (7) as follows. In one example embodiment, the signal is propagated through the pattern extractor module using the process 500 (e.g., FIG. 5) as shown in the following paragraphs.

At an initial stage, Net [ ] and Device [ ] are filled with '−1', indicating that they are empty (e.g., Valid names are represented by non-negative integers). The candidate for start node (device) is checked for pseudo-match (e.g., 6, 7). If the pseudo-match is passed, name (e.g., as in the target circuit) is filled in * (DeviceData [0].Name) and its terminal nets (e.g., as in the target circuit) are filled in * (DeviceData [0].Neighbor [ ]). It can be noted that while populating, the arrays Net [ ] and Device [ ] are filled, as elements of DeviceData [ ] and NetData [ ] are merely pointers to the former arrays.

Further, a Graph traversal scheme (e.g., explained in FIG. 7) is used to determine the next device, say i. The previous steps are repeated at DeviceData [i]. Therefore, the arrays Net [ ] and Device [ ] get filled with non-negative integers and when the recursion passes the $(N_d-1)^{th}$ level, none of the entries in the arrays shall be '−1'. As a consequence, the instance of the pattern circuit in the target circuit is reported to be identified.

Figure 6:
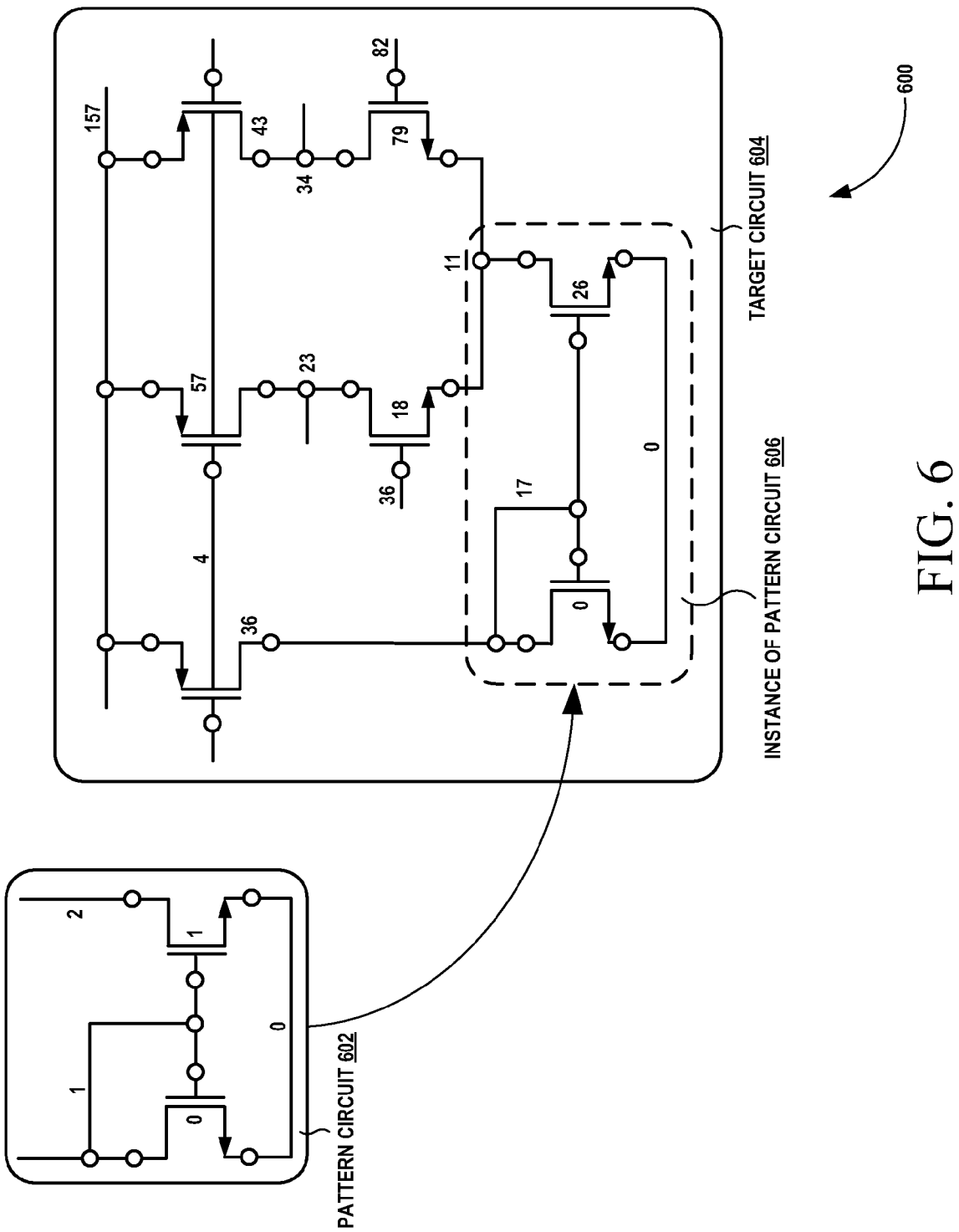
FIG. 6 is a block diagram which illustrates a process of identifying an instance of a pattern circuit in a target circuit, according to one embodiment.

FIG. 6 is a block diagram which illustrates a process of identifying an instance of a pattern circuit 606 in a target circuit 604, according to one embodiment. Particularly, FIG. 6 illustrates a modified version of FIG. 1, having the net names and the device names in the numerical storage format used by the algorithm. In one example embodiment, encoding the pattern circuit 602 and the target circuit 604 includes encoding character strings for device names and net names of the pattern circuit 602 and the target circuit 604 into corresponding numbers. Further, encoding the character stings into the corresponding numbers includes translating the character strings into the corresponding numbers using a hash function, and storing a codebook of the hash function.

In the example embodiment illustrated in FIG. 6, Net [ ] and Device [ ] have sizes as 3 and 2 respectively. Let the MOS terminal order be Gate-Drain-Source. Further, DeviceData [0].Neighbor [0-2] points to locations {Net [1], Net [1], Net [0]}, and DeviceData [1].Neighbor [0-2] points to locations {Net [1], Net [2], Net [0]}. As the pattern circuit 602 includes 2 devices, recursion goes to maximum 2 levels deep (i.e., level-0 and level-1) beyond which, the instances of the pattern circuit 606 is said to be identified.

For example, assume that the start node is '1' in the pattern circuit 602 and the procedure for finding the instances of pattern circuit 606 in the target circuit 604 is as below.

1. Suppose a device '36' in the target circuit 604 is checked for pseudo-matching with a first pattern device (e.g., 1) of the pattern circuit 602, and the types do not match (i.e., the pseudo-match does not exists between the device 36 and the pattern device). Then, the pseudo-matching proceeds with next device in the target circuit 604.
2. The next device '18' in the target circuit 604 is checked for pseudo-matching with the first pattern device (e.g., 1) of the pattern circuit 602, and the pseudo-match exists between them (i.e., the types are matched). Then {Net [1], Net [2], Net [0]} gets filled with {36, 23, 11} which indicates that the pseudo-match is passed and then proceeds to a second pattern device (i.e., 0) of the pattern circuit 602.
   a. The device '26' in the target circuit 604 is checked for pseudo-matching with the second pattern device (e.g., 0) of the pattern circuit 602, and the pseudo-match exists between them. Now while filling in the NetData {Net [1], Net [1], Net [0]}, net '17' tries to go to Net [1], but that location is already filled with a different value '36'. As a result, connectivity failure may happen.
   b. The next device '57' in the target circuit 604 is checked for pseudo-matching with the second pattern device (e.g., 0) of the pattern circuit 602, and the pseudo-match does not exists between them. So the pseudo-match proceeds with the next device in the target circuit 604.
   c. Similarly, the next device '79' in the target circuit 604 is checked for pseudo-matching with the second pattern device (e.g., 0) of the pattern circuit 602, and the pseudo-match exists between them. While filling in the NetData {Net [1], Net [1], Net [0]}, net '82' tries to go to Net [1], but that location is already filled with a different value '36'. As a result, connectivity failure may happen.
   d. If no more options are remaining for level-1, recursion falls back to level-0 to try next device at that level.
3. The next device '26' in the target circuit 604 is checked for pseudo-matching with the first pattern device (e.g., 1) of the pattern circuit 602, and the pseudo-match exists between them (i.e., the types are matched). Then {Net [1], Net [2], Net [0]} gets filled with {17, 11, 0} which indicates that the pseudo-match is passed and then proceeds to the second pattern device (i.e., 0) in the pattern circuit 602.
   a. The device '18' in the target circuit 604 is checked for pseudo-matching with the second pattern device (i.e., 0) of the pattern circuit 602, and the pseudo-match exists between them. Now while filling in the NetData {Net [1], Net [1], Net [0]}, net '36' tries to go to Net [1], but that location is already filled with a different value '17'. As a result, connectivity failure may happen.
   b. The next device '79' in the target circuit 604 is checked for pseudo-matching with the second pattern device (i.e., 0) of the pattern circuit 602, and the pseudo-match exists between them. Now while filling in the NetData {Net [1], Net [1], Net [0]}, net '82' tries to go to Net [1], but that location is already filled with a different value '17'. As a result, connectivity failure may happen.

c. The next device '0' in the target circuit 604 is checked for pseudo-matching with the second pattern device (i.e., 0) of the pattern circuit 602, and the pseudo-match exists between them. Now while filling in the NetData {Net [1], Net [1], Net [0]}, net '17' tries to go to Net [1] and this location is already filled with the value '17'. As a result, no connectivity failure may happen. Again '17' tries to go to Net [1] and the location is already filled with '17'. Hence no connectivity failure may happen. In addition, '0' tries to go to Net [0] and this location is already filled with '0'. Hence no connectivity failure may happen.

d. All the checks in the above point C are passed. As a result, the instance of the pattern circuit 606 is identified and reported as (0, 1) maps (17, 26). Since, no more options remaining in level-1 for pseudo-matching, the recursion falls back to level-0.

4. The above steps are repeated till all the devices in the target circuit 604 are analyzed.

Figure 7:
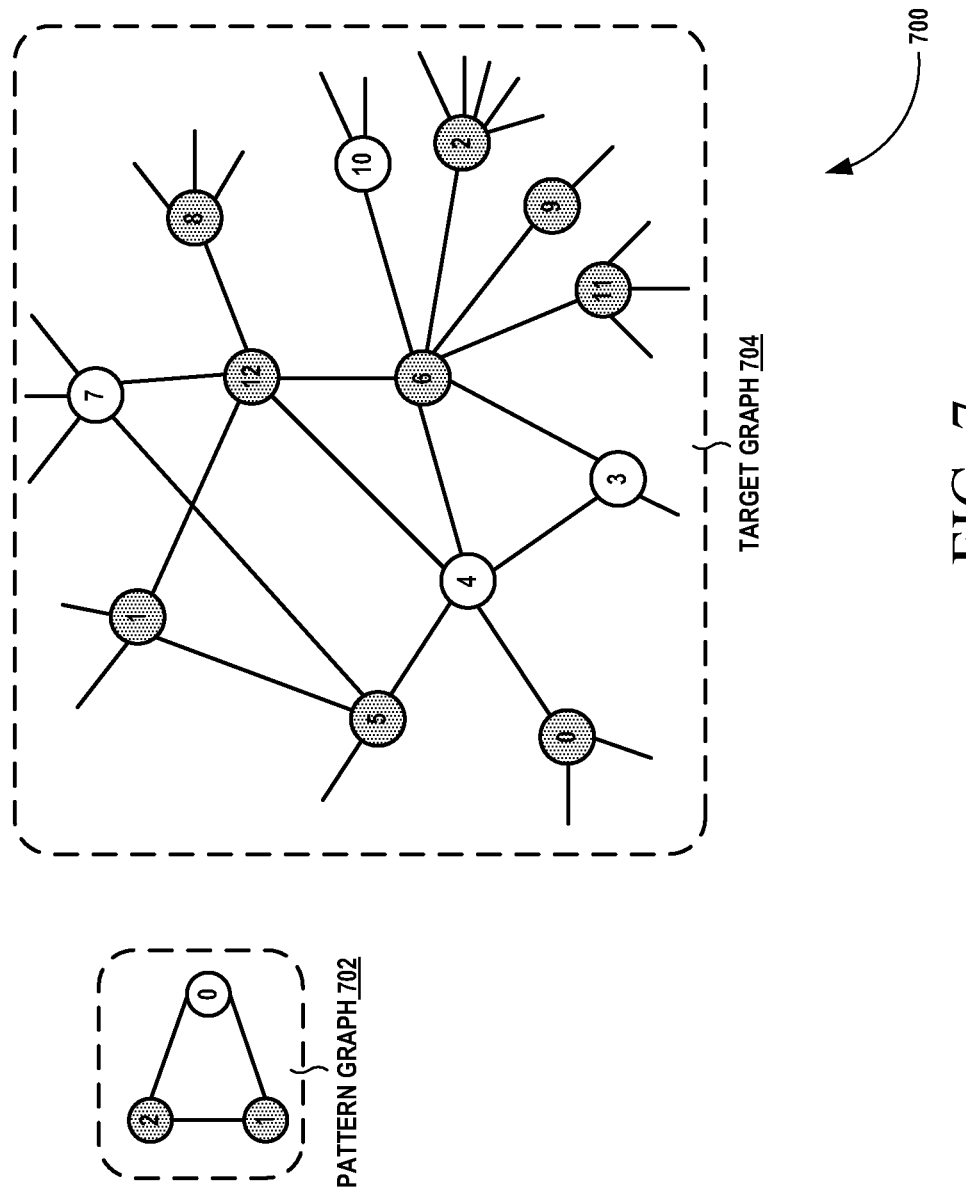
FIG. 7 illustrates an exemplary graph traversal scheme for efficient search of an instance of a pattern circuit in a target circuit, according to one embodiment.

FIG. 7 illustrates an exemplary graph traversal scheme for efficient search of an instance of a pattern circuit in a target circuit, according to one embodiment. Particularly, FIG. 7 illustrates a pattern graph 702 and a target graph 704. Further, the pattern graph 702 and the target graph 704 include 2 types of nodes i.e., white and gray, as shown in FIG. 7.

In the example embodiment illustrated in FIG. 7, assume that a node '4' of the target graph 704 is identified with a node '0' of the pattern graph 702 at level-0, and a node '6' of the target graph 704 is identified with a node '1' of the pattern graph 702 at level-1.

Further, the recursion proceeds to level-2, in which a match for node '2' of the pattern graph 702 is to be obtained in the target graph 704. In one example embodiment, the neighbors of either node '4' or node '6' is selected for searching the node '2' of the pattern graph 702 at level-2. In one exemplary implementation, if the neighbors of '6' are selected for searching, the nodes (i.e., 2, 3, 9, 10, and 11 of the target graph 704) fail to match with the node '2' of the pattern graph 702, and the node '12' (of the target graph) matches with the node '2' of the pattern graph 702.

Further, if the neighbors of the node '4' in the target graph 704 are selected for searching, the nodes (i.e., 0 and 5 in the target graph 704) fail to match with the node '2' of the pattern graph 702, and the node '12' (of the target graph) matches with the node '2' of the pattern graph. It can be noted that, a device is searched for only the nodes that are not already identified with some other nodes in the pattern graph 702.

Therefore, it is intuitive that the "identified-node with minimum number of neighbors remaining to be identified" is to be chosen as a path to a next node to be matched as that reduces the possibility of false pseudo-matches. Also, all the pattern devices are used for pseudo-matching, since the graph traversal scheme 700 is a branch-and-bound approach. Further, if a node of very high order (e.g., such as vdd/vss nets) is encountered, then the pattern graph 702 having an alternate path of searching the huge number of possible false pseudo-matches at the elements connected to those nets is avoided.

In one example embodiment, the graph traverse scheme 700 includes a list containing the number (i.e., order of already identified neighbors) for all the nets that is dynamically updated. Further, the index of lowest element is selected as the net to act as path to the next device. Accordingly, the neighbors of this net are tried out for proceeding to a next level of recursion.

In another example embodiment, the choice of start node in the pattern graph 702 from which the search starts also affects the total number of nodes in the graph that are traversed in searching. It is appreciated that the elements of the type that are least in number in the target circuit causes the pseudo-match check to fail for the other devices in the target graph 704 at starting level itself. Accordingly, a false pseudo match is rejected early in the recursion. Further, it is appreciated that, the search radius is lesser if the centre most node(s) (i.e., node(s) with least depth in breadth-first search (BFS) tree) in the pattern graph 702 is chosen as start node. Therefore, these 2 criterions are used as the strategy for choosing the start node in the pattern graph 702.

Figure 8:
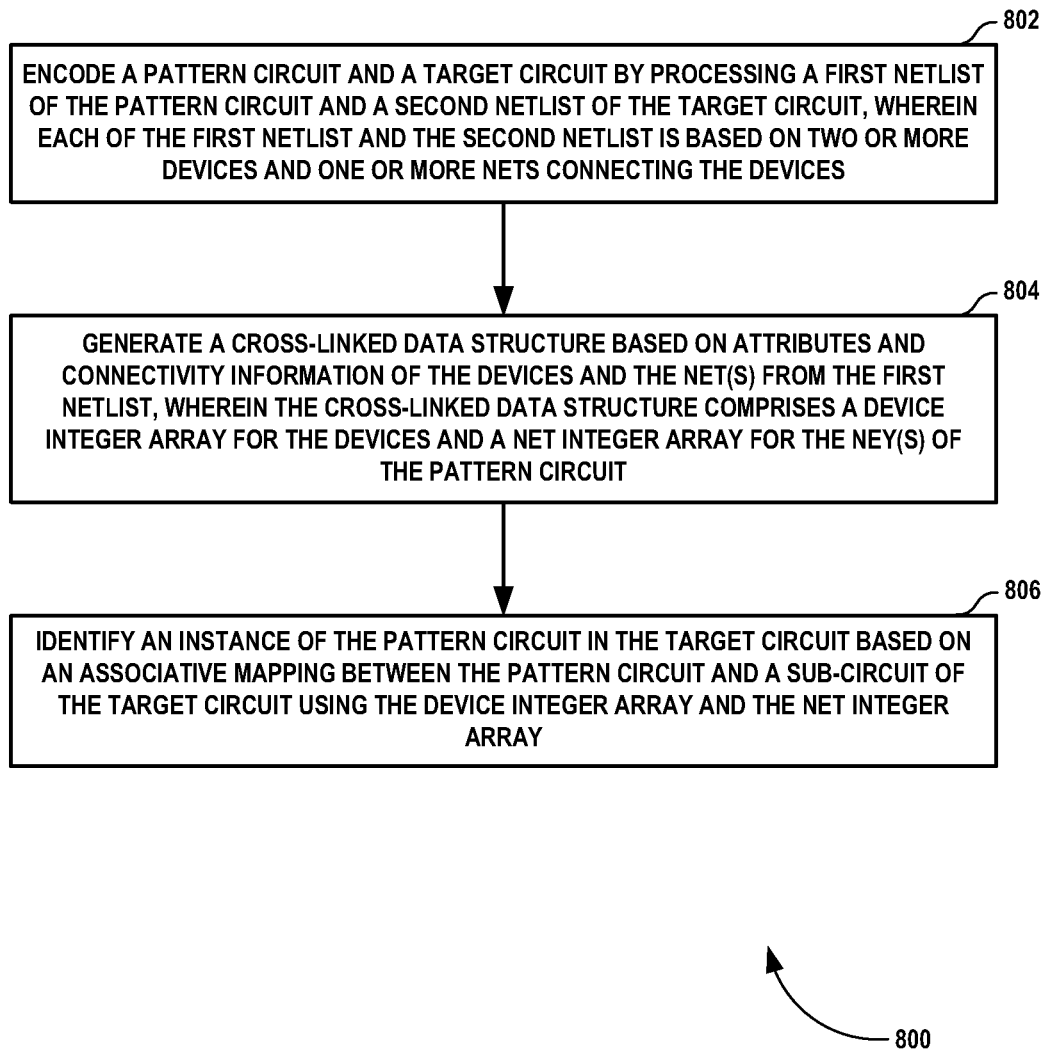
FIG. 8 is a process flow chart of an exemplary method for identifying an instance of a pattern circuit from a target circuit, according to one embodiment.

FIG. 8 is a process flow chart of an exemplary method for identifying an instance of a pattern circuit from a target circuit, according to one embodiment. Particularly, FIG. 8 illustrates a method for recognizing the pattern circuit in the target circuit in an integrated circuit design. In step 802, the pattern circuit and the target circuit are encoded by processing a first netlist of the pattern circuit and a second netlist of the target circuit. Each of the first netlist and the second netlist is based on at least two devices and at least one net connecting the at least two devices.

In one exemplary implementation, encoding the pattern circuit and the target circuit includes encoding character strings for device names and net names of the pattern circuit and the target circuit into corresponding numbers. Further, encoding the character stings into the corresponding numbers includes translating the character strings into the corresponding numbers using a hash function, and storing a codebook of the hash function. In one embodiment, the codebook is used to decode corresponding device names and net names associated with the sub-circuit of the target circuit.

In step 804, a cross-linked data structure is generated based on attributes and connectivity information of the at least two devices and the at least one net from the first netlist. In one example embodiment, the attributes include a name, a type, and an order, and the connectivity information includes at least one neighboring device or net.

In one embodiment, the cross-linked data structure includes a device integer array for the at least two devices and a net integer array for the at least one net of the pattern circuit. In one example embodiment, each index of the device integer array and the net integer array includes a name of each device and each net of the pattern circuit, respectively. In one exemplary implementation, each content of the device integer array and the net integer array is filled with −1 prior to the identifying the instance of the pattern circuit.

In step 806, an instance of the pattern circuit in the target circuit is identified based on an associative mapping between the pattern circuit and a sub-circuit of the target circuit using the device integer array and the net integer array. In one example embodiment, identifying the instance of the pattern circuit includes determining an order of the at least two devices from the pattern circuit for the associative mapping. In some embodiment, determining the order includes choosing a first pattern device from the pattern circuit whose type is the least in number in the target circuit and whose location is close to a center of the pattern circuit.

In one embodiment, identifying the instance of the pattern circuit includes selecting a first target device in the target circuit, and checking the first target device in the target circuit for pseudo-matching with the first pattern device of the pattern circuit. In one exemplary implementation, the pseudo-matching is performed by comparing a type of the first target device in the target circuit with the type of the first pattern device of the pattern circuit and a number of neighboring nets of the first target device with a number of neighboring nets of the first pattern device. In one example embodiment, if the pseudo-matching is determined, the identifying the instance of the pattern circuit includes writing a name of the first target device to the content of the first pattern device in the device integer array.

Further, identifying the instance of the pattern circuit includes selecting a second target device in the target circuit. In one example embodiment, the second target device is connected to one of the neighboring nets of the first target device, and the second target device has the least number of neighboring nets among target devices connected to the neighboring nets of the first target device. It is appreciated that, identifying the instance of the pattern circuit is realized if every content of the device integer array and the net integer array of the pattern circuit is filled up.

Moreover, in one example embodiment, a computer readable medium for recognizing the pattern circuit in the target circuit having instructions that, when executed by a computer, cause the computer to perform the method of FIG. 8.

The efficiency analysis performed using the above described method is explained as follows. Sub-graph Isomorphism is well known as an NP-complete problem. The Run-time depends not only on the size of the target circuit and the pattern circuit, but also on the connectivity between the nodes. The dependence on the latter is different for different graph traversal schemes. The dynamic node-order-adaptive search scheme is designed for reducing the total number of false pseudo-matches expecting a worst case. Various popular traverse schemes like BFS, DFS, etc involve building the binary decision tree of pseudo-match checks taking all the nodes in target, one after the other, as start node. All paths in the tree that lead to an identification of all nodes in the pattern graph are common for all traversing schemes. But the paths that fail a pseudo-match in an intermediate node differ and the method that minimizes latter has greater efficiency.

The proposed scheme searches amongst neighbors of the nets of minimum order first and only if there are no nets of lower order, then the ones with higher order are tried out. Hence it clearly minimizes the number of branches emerging out of nodes earlier in the decision tree and is much more efficient in reducing the total number of nodes traversed in the identification process. In the special case when all nets identified at a stage have same number of neighbors to search for in the target circuit, the traversal order resembles BFS. Due to the dynamic nature, the traversal order as in the pattern circuit keeps changing depending on the order of the nodes encountered in the target circuit.

The optimization by considering only the devices as the nodes for pseudo-match checks and using the nets only in the traversing scheme in the decision tree, leads to improvement of efficiency by a factor of roughly $(N_d+N_n)/N_d$. This was realizable through a minimal data structure proposed. The dynamic hash based decision tree scheme helps in efficient conversion of node name strings into numerical representation due to use of array indexing.

Further, the algorithm was implemented in C language and experimented on a wide range of analog/mixed signals as well as digital circuits for various types of pattern circuits as shown in the following table.

TABLE

| | Results on real designs | | | | |
|---|---|---|---|---|---|
| DIGITAL | Encode/setup phase | Nand (Nd = 4) | Nor (Nd = 4) | AOI (Nd = 8) | 2:1 Mux (Nd = 12) |
| Nd = 1737 | 30 | 40(48) | 30(9) | 20(0) | 40(29) |
| Nd = 9072 | 430 | 560(824) | 190(239) | 150(0) | 110(0) |
| Nd = 15399 | 180 | 540(635) | 390(289) | 230(14) | 280(27) |
| Nd = 264315 | 4760 | 11680(3448) | 9370(2846) | 39670(5916) | 4060(166) |
| ANALOG/MIXED SIGNAL | Encode/setup phase | NMOS CM (Nd = 2) | PMOS CM (Nd = 2) | Cascode NMOS CM (Nd = 4) | Differential amplifier (Nd = 5) |
| Nd = 1591 | 30 | 10(11) | 10(31) | 20(0) | 150(4) |
| Nd = 1747 | 30 | 10(5) | 10(8) | 30(0) | 70(9) |
| Nd = 5696 | 80 | 20(21) | 30(14) | 70(6) | 220(2) |
| Nd = 7352 | 90 | 40(15) | 40(4) | 120(0) | 460(3) |
| Nd = 12718 | 150 | 60(12) | 70(11) | 210(0) | 1990(4) |

The patterns used for analog/mixed signal target circuits consisted of current mirrors and differential pairs; and for the digital circuits, logic gates were used. The run time measured (on SUN UltraSparc IIi 440 MHz, 1 GB RAM) has been captured in the above table. In the table, Nd refers to device count of the target/pattern. Each entry is in the format "CPU time in milliseconds (Number of instances in target)".

The above described method reduces run-time for recognizing the pattern circuit in the target circuit. Hence, identifying the sub-circuits in large analog and mixed signal designs is performed in reasonable amount of time.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated circuit (ASIC)).

What is claimed is:

1. A method of using an apparatus for recognizing a pattern circuit in a target circuit, comprising:
    encoding, by using a computer, the pattern circuit and the target circuit by processing a first netlist of nets of the pattern circuit and a second netlist of nets of the target circuit, wherein each of the first netlist and the second netlist is based on at least two devices and there is at least one net connecting the at least two devices;
    generating a cross-linked data structure from the first netlist based on attributes and connectivity information of the at least two devices and the at least one net connecting the at least two devices, wherein the cross-linked data structure comprises a device integer array for the at least two devices of the pattern circuit and a net integer array for the at least one net of the pattern circuit; and identifying an instance of the pattern circuit in the target circuit based on an associative mapping between the pattern circuit and a first target device of the target circuit using the device integer array and the net integer array, wherein the identifying the instance of the pattern circuit includes selecting the first target device in the target circuit and selecting a second target device in the target circuit, wherein the second target device is connected to one of the neighboring nets of the first target device, and the second target device has the least number of neighboring nets among target devices connected to the neighboring nets of the first target device.

2. The method of claim 1, wherein the encoding the pattern circuit and the target circuit comprises encoding character strings for device names and net names of the pattern circuit and the target circuit into corresponding numbers.

3. The method of claim 2, wherein the encoding the character strings into the corresponding numbers comprises:
translating the character strings into the corresponding numbers using a hash function; and
storing a codebook of the hash function.

4. The method of claim 3, wherein the codebook is used to decode corresponding device names and net names associated with the sub-circuit of the target circuit.

5. The method of claim 4, wherein the attributes comprise a name, a type, and an order, and the connectivity information comprises at least one neighboring device or net.

6. The method of claim 5, wherein each index of the device integer array and the net integer array comprises a name of each device and each net of the pattern circuit, respectively.

7. The method of claim 6, wherein each content of the device integer array and the net integer array is filled with −1 prior to the identifying the instance of the pattern circuit.

8. The method of claim 1, wherein the identifying the instance of the pattern circuit comprises determining an order of the at least two devices from the pattern circuit for the associative mapping.

9. The method of claim 8, wherein the determining the order comprises choosing a first pattern device from the pattern circuit whose type is the least in number in the target circuit and whose location is close to a center of the pattern circuit.

10. A method of using an apparatus for recognizing a pattern circuit in a target circuit, comprising:
encoding, by using a computer, the pattern circuit and the target circuit by processing a first netlist of nets of the pattern circuit and a second netlist of nets of the target circuit, wherein each of the first netlist and the second netlist is based on at least two devices and there is at least one net connecting the at least two devices;
generating a cross-linked data structure from the first netlist based on attributes and connectivity information of the at least two devices and the at least one net connecting the at least two devices, wherein the cross-linked data structure comprises a device integer array for the at least two devices of the pattern circuit and a net integer array for the at least one net of the pattern circuit; and
identifying an instance of the pattern circuit in the target circuit based on an associative mapping between the pattern circuit and a first target device of the target circuit using the device integer array and the net integer array;
wherein the identifying the instance of the pattern circuit includes determining an order of the at least two devices from the pattern circuit for the associative mapping;
wherein the determining an order includes choosing a first pattern device from the pattern circuit whose type is the least in number in the target circuit and whose location is close to a center of the pattern circuit;
wherein the identifying the instance of the pattern circuit includes:
selecting a first target device in the target circuit; and
checking the first target device in the target circuit for pseudo-matching with the first pattern device of the pattern circuit,
wherein the pseudo-matching is performed by comparing a type of the first target device in the target circuit with the type of the first pattern device of the pattern circuit and a number of neighboring nets of the first target device with a number of neighboring nets of the first pattern device;
wherein, if the pseudo-matching is determined, the identifying the instance of the pattern circuit includes writing a name of the first target device to the content of the first pattern device in the device integer array; and
wherein the identifying the instance of the pattern circuit includes selecting a second target device in the target circuit, wherein the second target device is connected to one of the neighboring nets of the first target device, and the second target device has the least number of neighboring nets among target devices connected to the neighboring nets of the first target device.

11. The method of claim 10, wherein the identifying the instance of the pattern circuit is realized if every content of the device integer array and the net integer array of the pattern circuit is filled up.

12. A system for recognizing a pattern circuit in a target circuit, comprising:
at least one processor;
an encoder module operating in the processor for encoding the pattern circuit and the target circuit by processing a first netlist of nets of the pattern circuit and a second netlist of nets of the target circuit, wherein each of the first netlist and the second netlist is based on at least two devices and at least one net connecting the at least two devices;
a data structure generator module from the first netlist for generating a cross-linked data structure based on attributes and connectivity information of the at least two devices and the at least one net connecting the at least two devices, wherein the cross-linked data structure comprises a device integer array for the at least two devices of the pattern circuit and a net integer array for the at least one net of the pattern circuit; and
a pattern extractor module for identifying an instance of the pattern circuit in the target circuit based on an associative mapping between the pattern circuit and a first target device of the target circuit using the device integer array and the net integer array, wherein the identifying the instance of the pattern circuit includes selecting the first target device in the target circuit and selecting a second target device in the target circuit, wherein the second target device is connected to one of the neighboring nets of the first target device, and the second target device has the least number of neighboring nets among target devices connected to the neighboring nets of the first target device.

13. The system of claim 12, wherein the encoder module is operable for encoding character strings for device names and net names of the pattern circuit and the target circuit into corresponding numbers.

14. The system of claim 12, further comprising a decoder module for decoding corresponding device names and net names associated with the sub-circuit of the target circuit.

15. The system of claim 12, wherein the attributes comprise a name, a type, and an order, and the connectivity information comprises at least one neighboring device or net.

16. The system of claim 15, wherein each index of the device integer array and the net integer array comprises a name of each device and each net of the pattern circuit, respectively, and wherein each content of the device integer array and the net integer array is filled with −1 prior to the identifying the instance of the pattern circuit.

17. The system of claim 12, wherein the identifying the instance of the pattern circuit comprises determining an order of the at least two devices from the pattern circuit for the associative mapping, and wherein the determining the order comprises choosing a first pattern device from the pattern circuit whose type is the least in number in the target circuit and whose location is close to a center of the pattern circuit.

18. A non-transitory computer readable medium for recognizing a pattern circuit in a target circuit having instructions that, when executed by a computer, cause the computer to perform a method comprising:

encoding the pattern circuit and the target circuit by processing a first netlist of the pattern circuit and a second netlist of the target circuit, wherein each of the first netlist and the second netlist is based on at least two devices and there is at least one net connecting the at least two devices;

generating a cross-linked data structure from the first netlist based on attributes and connectivity information of the at least two devices and the at least one net connecting the at least two devices, wherein the cross-linked data structure comprises a device integer array for the at least two devices of the pattern circuit and a net integer array for the at least one net of the pattern circuit; and identifying an instance of the pattern circuit in the target circuit based on an associative mapping between the pattern circuit and a first target device of the target circuit using the device integer array and the net integer array, wherein the identifying the instance of the pattern circuit includes selecting the first target device in the target circuit and selecting a second target device in the target circuit, wherein the second target device is connected to one of the neighboring nets of the first target device, and the second target device has the least number of neighboring nets among target devices connected to the neighboring nets of the first target device.

* * * * *